US009379139B2

(12) United States Patent
Jeon et al.

(10) Patent No.: US 9,379,139 B2
(45) Date of Patent: Jun. 28, 2016

(54) DISPLAY APPARATUS AND MULTI-PANEL DISPLAY APPARATUS

(71) Applicant: SAMSUNG DISPLAY CO., LTD., Yongin, Gyeonggi-Do (KR)

(72) Inventors: Sangjin Jeon, Suwon-si (KR); Ilgon Kim, Seoul (KR); Bonghyun You, Yongin-si (KR); Meehye Jung, Suwon-si (KR); Junki Jeong, Anyang-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/273,415

(22) Filed: May 8, 2014

(65) Prior Publication Data

US 2015/0115292 A1    Apr. 30, 2015

(30) Foreign Application Priority Data

Oct. 24, 2013   (KR) .......................... 10-2013-0127430

(51) Int. Cl.
*H01L 27/12* (2006.01)
*G02F 1/1345* (2006.01)

(52) U.S. Cl.
CPC .......... *H01L 27/124* (2013.01); *G02F 1/13452* (2013.01); *G02F 2001/13456* (2013.01)

(58) Field of Classification Search
CPC ...... G09G 3/36; H05K 1/0289; H01L 27/124; G02F 1/3452
USPC ........ 257/88; 327/109; 349/149, 40, 151, 139
See application file for complete search history.

(56) References Cited

U.S. PATENT DOCUMENTS

| 5,897,228 | A | | 4/1999 | Schrock |
| 6,104,465 | A | * | 8/2000 | Na et al. ........................ 349/152 |
| 6,760,536 | B1 | | 7/2004 | Amir et al. |
| 6,903,717 | B2 | * | 6/2005 | Takahashi et al. ............ 345/100 |
| 7,466,387 | B2 | * | 12/2008 | Kim et al. ..................... 349/149 |

(Continued)

FOREIGN PATENT DOCUMENTS

| JP | 2003-005670 | 1/2003 |
| KR | 10-2006-0078675 | 7/2006 |

(Continued)

OTHER PUBLICATIONS

Korean Patent Abstracts Publication No. KR 10-2005-0065784 A, dated Jun. 30, 2005, for KR 10-0989226, 1 page.

*Primary Examiner* — Cuong Q Nguyen
*Assistant Examiner* — Tong-Ho Kim
(74) *Attorney, Agent, or Firm* — Lewis Roca Rothgerber Christie LLP (57) ABSTRACT

A display apparatus includes a thin film transistor substrate, a gate driver, and a connection line. The thin film transistor substrate includes a display area and a non-display area surrounding the display area. The display area includes gate lines extending along a first direction and data lines extending along a second direction crossing the first direction. The data lines are insulated from the gate lines. The gate driver is at a first non-display area of the non-display area, located outside the display area along the second direction, and is configured to apply a gate signal to the gate lines. The connection line extends along the second direction and couples the gate driver and the gate lines. A resistance of the connection line coupled to a gate line is substantially equal to a resistance of the connection line coupled to another gate line.

11 Claims, 8 Drawing Sheets

(56) References Cited

U.S. PATENT DOCUMENTS

| | | |
|---|---|---|
| 8,144,114 B2 | 3/2012 | Jeon et al. |
| 8,471,981 B2 * | 6/2013 | Kim et al. ............... 349/73 |
| 2006/0114209 A1 * | 6/2006 | Kim et al. ............... 345/94 |
| 2008/0129717 A1 * | 6/2008 | Lee et al. ............... 345/204 |
| 2008/0158124 A1 | 7/2008 | Kim |
| 2012/0235713 A1 | 9/2012 | Mori |
| 2013/0229400 A1 * | 9/2013 | Kim et al. ............... 345/212 |
| 2014/0104252 A1 * | 4/2014 | Park ............... G09G 3/2096 345/205 |

FOREIGN PATENT DOCUMENTS

| | | |
|---|---|---|
| KR | 10-2007-0064458 | 6/2007 |
| KR | 10-2008-0076519 | 8/2008 |
| KR | 10-0989226 | 10/2010 |

* cited by examiner

DISPLAY APPARATUS AND MULTI-PANEL DISPLAY APPARATUS

CROSS-REFERENCE TO RELATED APPLICATION

This patent application claims priority to and the benefit of Korean Patent Application No. 10-2013-0127430, filed on Oct. 24, 2013 in the Korean Intellectual Property Office, the content of which is hereby incorporated by reference in its entirety.

BACKGROUND

1. Field

Aspects of embodiments of the present disclosure are directed toward a display apparatus and a multi-panel display apparatus.

2. Description of the Related Art

In general, a display apparatus includes a display panel and a driver to drive the display panel. The display panel includes a display area in which an image is displayed and a non-display area surrounding the display area. The display area includes gate lines extending along a first direction and data lines extending along a second direction crossing the first direction.

The driver includes a timing controller, a gate driver, and a data driver. The gate driver is disposed in the non-display area, positioned at an outer side of the display area along the first direction, and coupled (e.g., connected) to the gate lines. The data driver is mounted on a chip-on-film package or a printed circuit board, and the chip-on-film package or the printed circuit board is disposed in the non-display area at an outer side of the display area along the second direction.

SUMMARY

Aspects of embodiments of the present disclosure are directed toward a display apparatus and a multi-panel display apparatus which are capable of reducing a width of a bezel thereof.

Aspects of embodiments of the present disclosure are directed toward a display apparatus and a multi-panel display apparatus which are capable of uniformly maintaining a delay time of a gate signal applied to each gate line even when a gate driver is disposed at a non-display area, for example, outside a display area along a vertical direction (e.g., a direction perpendicular to a direction along which the gate lines extend).

Embodiments of the inventive concept include a display apparatus including a thin film transistor substrate, a gate driver, and a connection line. The thin film transistor substrate includes a display area and a non-display area surrounding the display area. The display area includes gate lines extending along a first direction and data lines extending along a second direction crossing the first direction and insulated from the gate lines.

In one embodiment, the gate driver is at a first non-display area of the non-display area outside the display area along the second direction and is configured to apply a gate signal to the gate lines. In one embodiment, the connection line extends along the second direction and couples the gate driver and the gate lines.

In one embodiment, a resistance of the connection line coupled to an i-th gate line (i being a positive integer number) of the gate lines is substantially equal to a resistance of the connection line coupled to a j-th gate line (j being a positive integer number and j≠i). A length of the connection line coupled to the i-th gate line may be substantially equal to a length of the connection line coupled to the j-th gate line.

The connection line may include a first partial connection line coupled to the i-th gate line and a second partial connection line coupled to the j-th gate line, and a length of the first partial connection line may be substantially equal to a length of the second partial connection line.

The gate driver may include a first gate driver and a second gate driver spaced from the first gate driver. The connection line may include main connection lines coupling the first gate driver to each of the gate lines and sub-connection lines coupling the second gate driver to each of the gate lines.

Each of the gate lines may be coupled to one main connection line of the main connection lines and one sub-connection line of the sub connection lines. The main connection lines may have lengths different from each other, and the sub-connection lines may have lengths different from each other. Each of the main connection lines may have a length shorter than that of each of the sub-connection lines.

The length of each of the main connection lines may be the shortest length between the first gate driver and each of the gate lines along the second direction.

The sub-connection lines may extend from the second gate driver along the second direction through the display area and may be bent at the first non-display area to be coupled to the respective gate lines.

The connection line may be spaced from and insulated from the data lines. At least a portion of the connection line may be at a same layer as the data lines.

The thin film transistor substrate may further include a gate insulating layer between the gate lines and the data lines. The gate insulating layer may have a contact opening. The connection line may be electrically coupled to the respective gate line at the contact opening.

Each of the connection lines may have substantially equal lengths.

The connection lines may include fan-out parts extending from the gate driver and at the first non-display area, and extension parts extending from the fan-out parts and coupled to the gate lines. At least one of the fan-out parts may have a zigzag shape and/or be bent a plurality of times.

The fan-out parts may have lengths different from each other, and the extension parts may have lengths different from each other. A difference in length between an i-th fan-out part and a j-th fan-out part among the fan-out parts may be substantially equal to a difference in length between an i-th extension part and a j-th extension part among the extension parts. The difference in length between the i-th fan-out part and the j-th fan-out part may be substantially equal to a distance between the i-th gate line and the j-th gate line along the second direction.

The display apparatus may further include a printed circuit board configured to drive the thin film transistor substrate, and a flexible printed circuit board that electrically couples the thin film transistor substrate to the printed circuit board.

Embodiments of the inventive concept include a multi-panel display apparatus including a plurality of display panels adjacent to each other along a first direction, a printed circuit board, and a flexible printed circuit board. The printed circuit board is configured to drive the display panels. The flexible printed circuit board electrically couples the display panels to the printed circuit board.

According to the above, the width of the bezel may be reduced along one direction. In addition, the delay time of the signal applied to each gate line may be uniformly maintained even when the gate driver is disposed at the non-display area, for example, outside the display area along the direction crossing (e.g., substantially perpendicular to) the direction along which the gate lines extend.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION

It will be understood that when an element or layer is referred to as being "on", "connected to", or "coupled to" another element or layer, it can be directly on, connected, or coupled to the other element or layer or intervening elements or layers may also be present. When an element is referred to as being "directly on," "directly connected to", or "directly coupled to" another element or layer, there are no intervening elements or layers present. Like reference designators refer to like elements throughout. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, the use of "may" when describing embodiments of the present invention refers to "one or more embodiments of the present invention."

Hereinafter, the present invention will be explained in detail with reference to the accompanying drawings.

Figure 1:
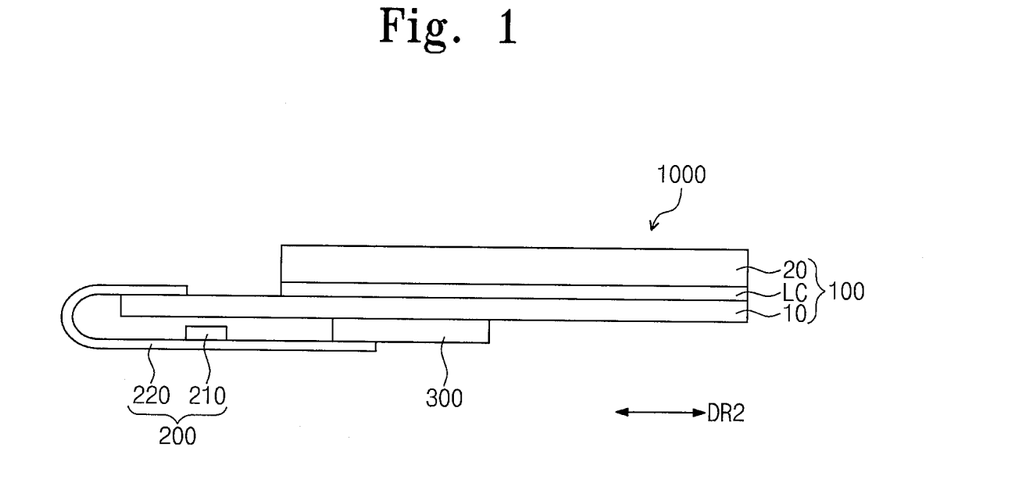
FIG. 1 is a cross-sectional view showing a display apparatus according to an example embodiment of the present disclosure.
Figure 2:
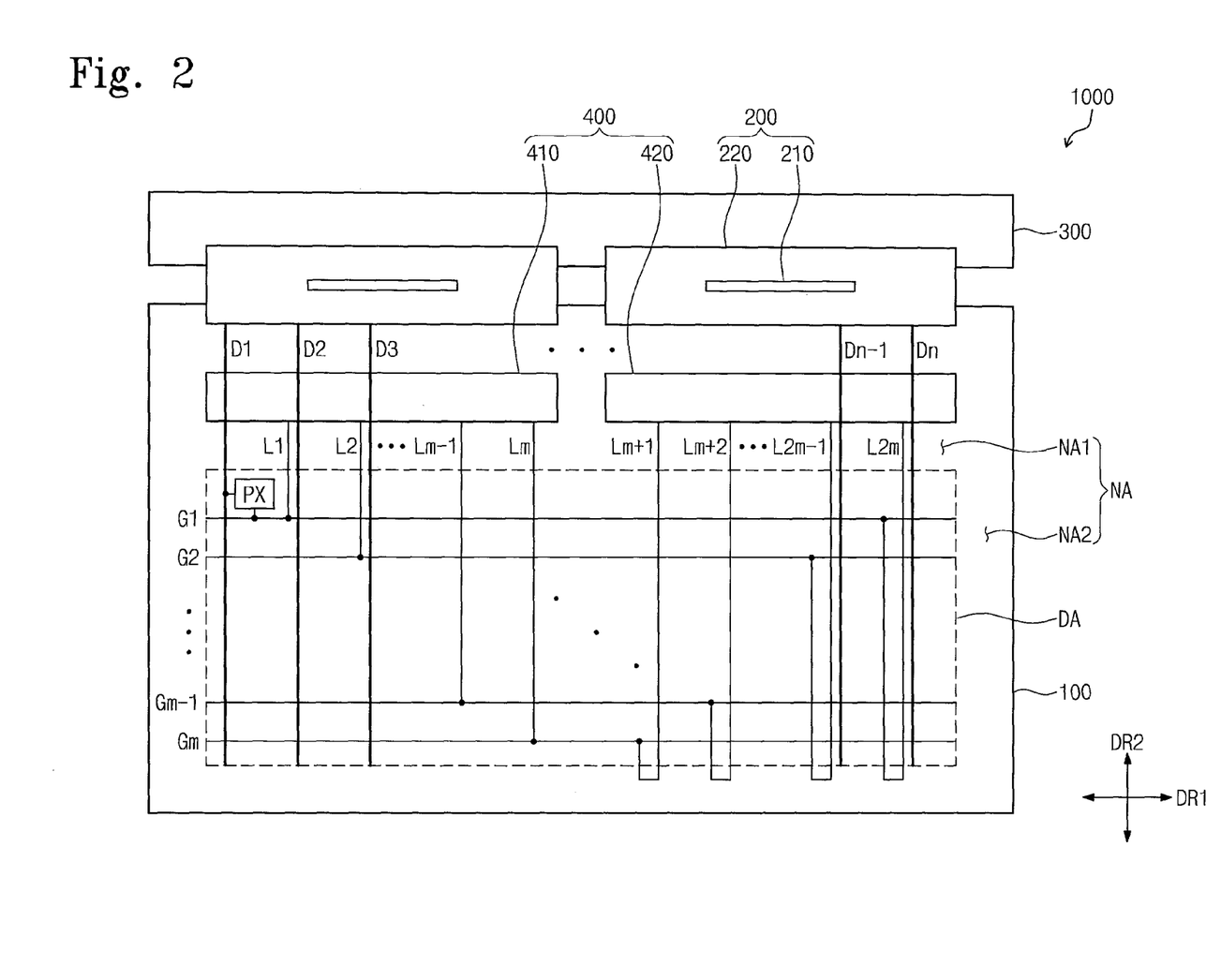
FIG. 2 is a plan view showing the display apparatus shown in FIG. 1.
Figure 3:
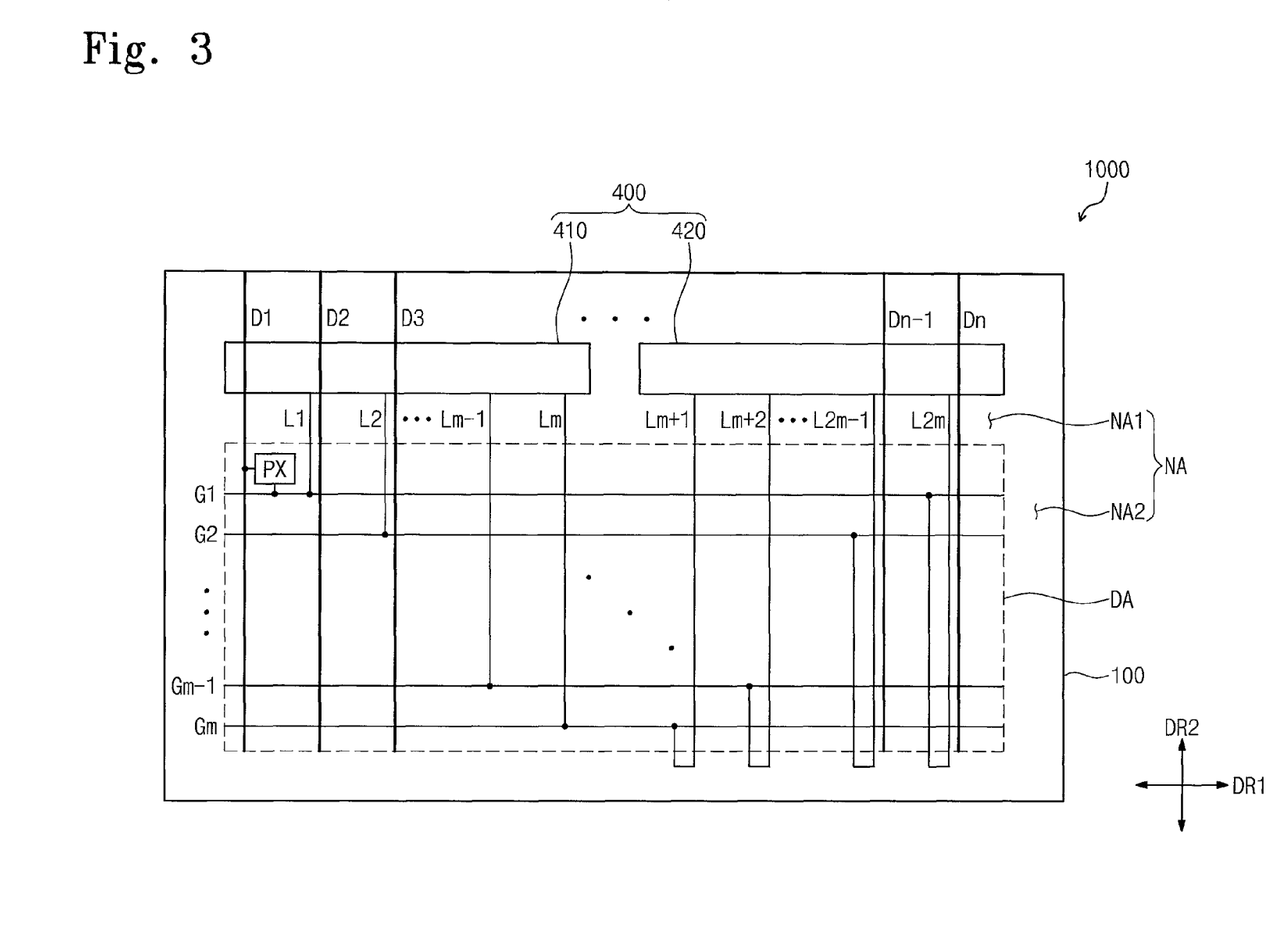
FIG. 3 is a plan view showing the display panel shown in FIG. 2.

FIG. 1 is a cross-sectional view showing a display apparatus 1000 according to an example embodiment of the present disclosure, FIG. 2 is a plan view showing the display apparatus 1000 shown in FIG. 1, and FIG. 3 is a plan view showing a display panel 100 shown in FIG. 2.

Referring to FIGS. 1 to 3, the display apparatus 1000 includes a display panel 100, a flexible printed circuit board 200, and a printed circuit board 300.

The display panel 100 displays an image (e.g., is configured to display an image). The display panel 100 may be various display panels, such as an organic light emitting display panel, a liquid crystal display panel, a plasma display panel, an electrophoretic display panel, an electrowetting display panel, etc. Hereinafter, the liquid crystal display panel will be described as the display panel 100.

The display panel 100 includes a thin film transistor substrate 10, an opposite substrate 20, and a liquid crystal layer LC between the thin film transistor substrate 10 and the opposite substrate 20.

The thin film transistor substrate 10 includes a display area DA and a non-display area NA surrounding the display area DA. The image is displayed in the display area DA and not displayed in the non-display area NA because a light traveling to (e.g., emitted toward) the non-display area NA is blocked by a black matrix.

The display area DA includes a plurality of gate lines G1 to Gm, a plurality of data lines D1 to Dn, and a plurality of pixels PX arranged at areas in a matrix form, the areas of the matrix being defined by the gate lines G1 to Gm and the data lines D1 to Dn. The gate lines G1 to Gm extend along a first direction DR1 and are arranged along a second direction DR2 crossing (e.g., substantially perpendicular to) the first direction DR1 and spaced from (e.g., spaced apart from) each other. The data lines D1 to Dn are electrically insulated from the gate lines G1 to Gm. The data lines D1 to Dn extend along the second direction DR2 and are arranged along the first direction DR1 to be spaced from (e.g., spaced apart from) each other.

The non-display area NA includes a first non-display area NA1 and a second non-display area NA2. The first non-display area NA1 corresponds to one or more outer areas of the display area DA along the second direction DR2. In FIGS. 2 and 3, the first non-display area NA1 corresponds to areas above and below the display area DA. The second non-display area NA2 corresponds to one or more outer areas of the display area DA along the first direction DR1. In FIGS. 2 and 3, the second non-display area NA2 corresponds to areas to the left and right of the display area DA.

The opposite substrate 20 is disposed to face the thin film transistor substrate 10. The opposite substrate 20 includes a color filter to assign a color value to the image and the black matrix overlapped with the non-display area NA.

The liquid crystal layer LC includes liquid crystal molecules having a dielectric anisotropy. The liquid crystal molecules of the liquid crystal layer LC are aligned along a direction (e.g., a specific direction) in accordance with an electric field applied to the liquid crystal layer LC to control a transmittance of the liquid crystal layer LC (that is, to control the amount of light passing through the liquid crystal layer LC).

The flexible printed circuit board 200 is electrically coupled (e.g., electrically connected) between the display panel 100 and the printed circuit board 300. The flexible printed circuit board 200 includes a base film 220 and an integrated circuit chip 210 disposed on the base film 220.

As shown in FIGS. 1 and 2, the flexible printed circuit board 200 includes two flexible printed circuit boards 200, and the two flexible printed circuit boards 200 are spaced from (e.g., spaced apart from) each other along the first direction DR1. However, the number of the flexible printed circuit boards 200 should not be limited to two. That is, the display apparatus 1000 may include one or three or more flexible printed circuit boards.

The flexible printed circuit board 200 may be mounted on a lower surface of the display panel 100 after being bent in a "C" shape. For example, the flexible printed circuit board 200 extends along a side surface of the thin film transistor substrate 10 from an upper surface of the thin film transistor substrate 10 and is fixed to the lower surface of the thin film transistor substrate 10. To this end, the flexible printed circuit board 200 is flexible.

The printed circuit board 300 drives the display panel 100 (e.g., the printed circuit board 300 drives the thin film transistor substrate 10). The printed circuit board 300 includes a driving substrate and a plurality of circuit components mounted on the driving substrate. Because the flexible printed circuit board 200 is bent toward the lower surface of the thin film transistor substrate 10, the printed circuit board 300 may be mounted on the lower surface of the thin film transistor substrate 10.

The display apparatus 1000 includes a timing controller, a gate driver 400, and a data driver.

The timing controller may be mounted either on the flexible printed circuit board 200 and/or the printed circuit board 300. The timing controller receives a control signal to generate a gate control signal and a data control signal. The timing controller applies (e.g., transmits) the gate control signal to the gate driver 400 and applies (e.g., transmits) the data control signal to the data driver. The timing controller receives an image signal and applies (e.g., transmits) the image signal to the data driver.

The gate control signal includes a vertical start signal to start an operation of the gate driver 400 and a gate clock signal to determine an output timing of the gate signal.

The data control signal includes a horizontal start signal to start an operation of the data driver, a polarity inversion signal to control a polarity of data voltage output from the data driver, and a load signal to determine an output timing of the data voltage.

The gate driver 400 may be mounted on the thin film transistor substrate 10. For example, the gate driver 400 is disposed to overlap with the first non-display area NA1. In FIGS. 2 and 3, the gate driver 400 is disposed to overlap with the first non-display area NA1 between the display area DA and the flexible printed circuit board 200.

The gate driver 400 generates the gate signal in response to the gate control signal. The gate driver 400 is electrically coupled to (e.g., electrically connected to) the gate lines G1 to Gm to sequentially apply the gate signal to the gate lines G1 to Gm.

The display panel 100 may further include connection lines L1 to L2m to couple (e.g., connect) the gate driver 400 to the gate lines G1 to Gm. The connection lines L1 to L2m extend along the second direction DR2 and are spaced from (e.g., spaced apart from) the data lines D1 to Dn.

The gate driver 400 includes a first gate driver 410 and a second gate driver 420 spaced from (e.g., spaced apart from) the first gate driver 410.

Each of the first and second gate drivers 410 and 420 may be coupled to (e.g., connected to) the gate lines G1 to Gm.

The connection lines L1 to L2m include main connection lines L1 to Lm and sub-connection lines Lm+1 to L2m. The main connection lines L1 to Lm couple (e.g., connect) the first gate driver 410 to the gate lines G1 to Gm, and the sub-connection lines Lm+1 to L2m couple (e.g., connect) the second gate driver 420 to the gate lines G1 to Gm. The number of the main connection lines L1 to Lm and the number of the sub-connection lines Lm+1 to L2m may each be equal to the number of the gate lines G1 to Gm. The main connection lines L1 to Lm are respectively coupled to (e.g., connected to) the gate lines G1 to Gm, and the sub-connection lines Lm+1 to L2m are coupled to (e.g., connected to) the gate lines G1 to Gm in a one-to-one arrangement.

The main connection lines L1 to Lm have different lengths, and the sub-connection lines Lm+1 to L2m have different lengths. In the present example embodiment, the lengths of the main connection lines L1 to Lm and the lengths of the sub-connection lines Lm+1 to L2m increase (e.g., gradually increase) along the first direction DR1 as shown in FIGS. 2 and 3 (e.g., increase according to a position of the main connection line or the sub-connection line along the first direction DR1).

Each of the main connection lines L1 to Lm has a length shorter than that of each of the sub-connection lines Lm+1 to L2m. For instance, the main connection lines L1 to Lm may be coupled to (e.g., connected to) the gate lines G1 to Gm via a shortest distance between the first gate driver 410 and the gate lines G1 to Gm along the second direction DR2. In addition, the sub-connection lines Lm+1 to L2m extend along the second direction DR2 from the second gate driver 420, are bent at the first non-display area NA1 outside of an m-th gate line Gm (e.g., the first non-display area NA1 opposite to the first non-display area NA1 at which the gate driver 400 is located) after passing through the display area DA, and then are coupled to (e.g., connected to) the gate lines G1 to Gm.

Each of the gate lines G1 to Gm is coupled to (e.g., connected to) one main connection line of the main connection lines L1 to Lm and one sub-connection line of the sub-connection lines Lm+1 to L2m. For example, a first gate line G1 is coupled to (e.g., connected to) a first main connection line L1 and a 2m-th sub-connection line L2m. Similarly, the m-th gate line Gm is coupled to (e.g., connected to) an m-th main connection line Lm and an (m+1)th sub-connection line Lm+1.

A resistance of two connection lines (that is, one main control line and one sub-connection line) coupled to (e.g., connected to) an i-th gate line (i is a positive integer number) may be substantially equal (e.g., equal) to a resistance of two connection lines coupled to (e.g., connected to) a j-th gate line (j is a positive integer number and j≠i). The resistance of each connection line is in proportion to a length of the respective connection line, and thus a total length of the two connection lines (that is, a first partial connection line) coupled to (e.g., connected to) the i-th gate line may be equal to a total length of the two connection lines (that is, a second partial connection line) coupled to (e.g., connected to) the j-th gate line. For instance, the total length of the first main connection line L1 and the 2m-th sub-connection line L2m, which are both coupled to (e.g., connected to) the first gate line G1, may be substantially equal (e.g., equal) to the total length of the m-th main connection line Lm and the (m+1)th sub-connection line Lm+1, which are both coupled to (e.g., connected to) the m-th gate line Gm.

Figure 4:
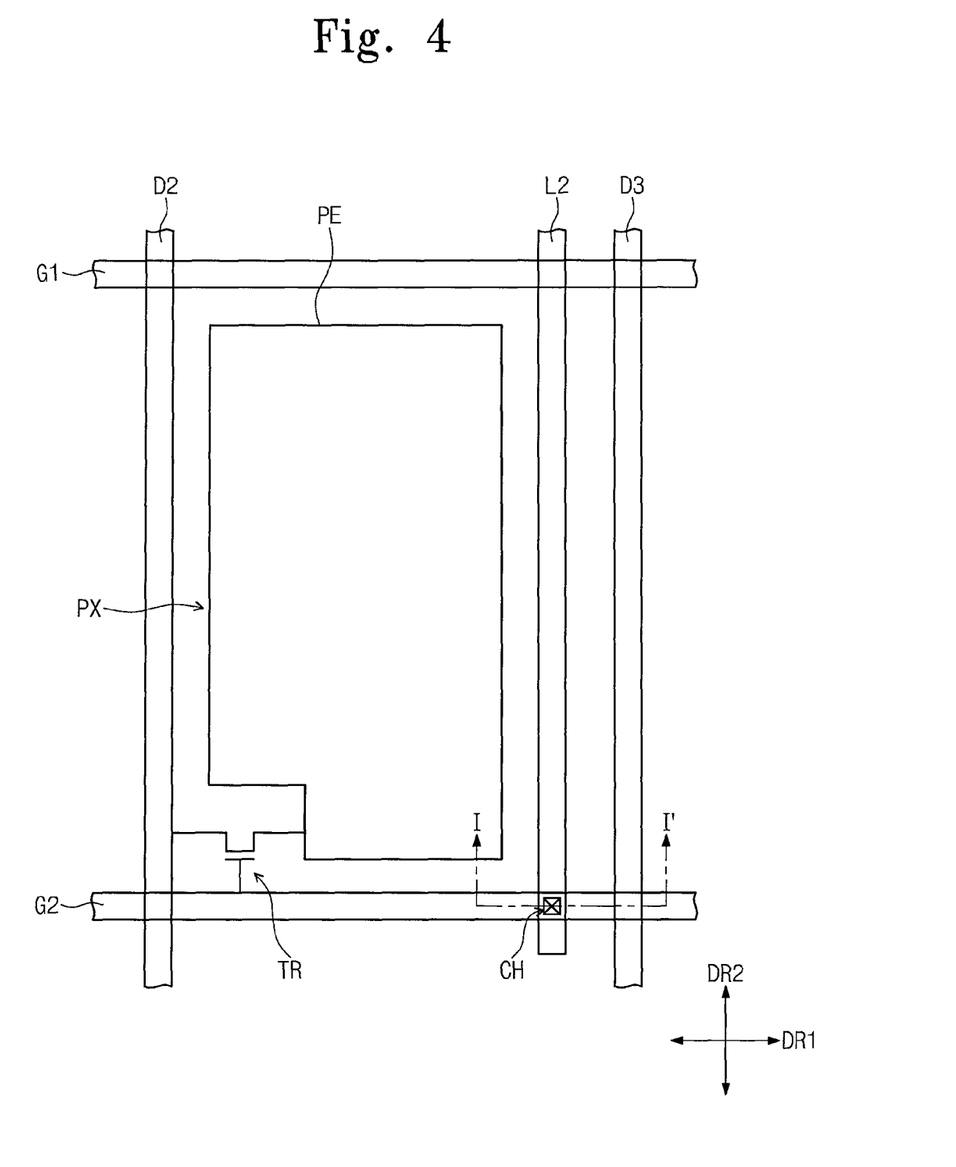
FIG. 4 is a view showing one pixel and a peripheral portion of the one pixel shown in FIG. 2.
Figure 5:
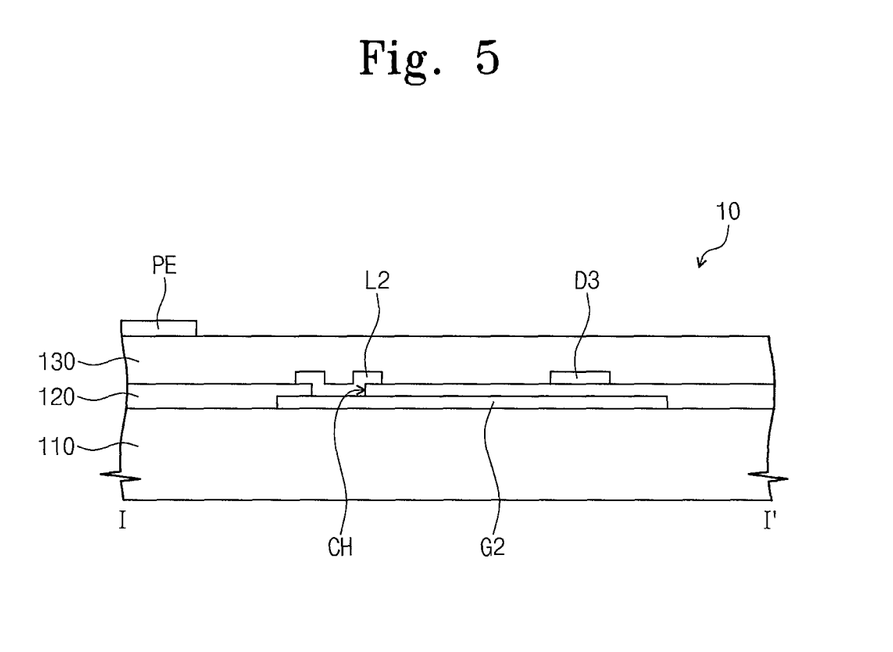
FIG. 5 is a cross-sectional view taken along the line I-I' of FIG. 4.

FIG. 4 is a view showing one pixel and a peripheral portion of the one pixel shown in FIG. 2, and FIG. 5 is a cross-sectional view taken along the line I-I' of FIG. 4. The pixel PX shown in FIG. 4 is disposed in a pixel area defined by the first gate line G1, a second gate line G2, a second data line D2, and a third data line D3.

Referring to FIGS. 4 and 5, the pixel PX includes a thin film transistor TR, a pixel electrode PE, and a common electrode. The thin film transistor TR is disposed on the base substrate 110 of the thin film transistor substrate 10 shown in FIG. 1. The thin film transistor TR provides the data voltage that is applied to the data line D2 in response to the gate signal applied to the gate line G2.

The pixel electrode PE is disposed on the thin film transistor substrate 10 and coupled to (e.g., connected to) the thin film transistor TR. An aperture ratio of the pixel PX is determined depending on an area (e.g., a surface area) of the pixel electrode PE. The pixel electrode PE may be provided with slits to, for example, improve visibility.

The common electrode is disposed on the opposite substrate 20 (refer to FIG. 1), but it should not be limited thereto or thereby. That is, the common electrode may be disposed on the thin film transistor substrate 10 in accordance with a driving mode of the display apparatus 1000. The common electrode receives a common voltage.

A gate insulating layer 120 is disposed on the gate line G2. The gate lines G1 and G2 are electrically insulated from the data lines D2 and D3 by the gate insulating layer 120.

The connection line L2 is spaced from (e.g., spaced apart from) the data line D3 to be insulated from the data line D3. At least a portion of the connection line L2 may be disposed on the same layer as the data line D3. The connection line L2 is formed in the same act as the data line D3 and includes substantially the same or the same material as that of the data line D3.

The connection line L2 is disposed not to overlap with the pixel electrode PE when viewed in a plan view, and thus, the aperture ratio of the display panel 100 is not reduced.

When viewed in a plan view, the gate insulating layer 120 is provided with a contact opening CH (e.g., a contact hole) formed at an area in which the gate line G2 crosses the connection line L2, and the connection line L2 is disposed to correspond to the contact opening CH. The connection line L2 is electrically coupled to (e.g., electrically connected to) the gate line G2 at (e.g., through) the contact opening CH.

An insulating layer 130 is disposed on the gate insulating layer 120 to cover the connection line L2 and the data line D3, and the pixel electrode PE is disposed on the insulating layer 130.

According to the display apparatus, because the gate driver 400 is disposed in the first non-display area NA1, a width of the second non-display area NA2 along the first direction DR1 may be reduced (e.g., substantially reduced). Therefore, a width of the bezel of the display apparatus may be reduced along the first direction DR1.

In addition, the gate driver 400 is coupled to (e.g., connected to) the gate lines G1 to Gm by the connection lines L1 to L2m, and thus, the gate lines G1 to Gm may be stably driven. When the connection lines L1 to L2m coupled to (e.g., connected to) the gate lines G1 to Gm have resistances different from each other, the delay time of the gate signal applied to the gate lines G1 to Gm varies due to a resistance difference or a time constant difference, thereby causing defects in the image. According to the present example embodiment, however, the connection lines (e.g., the two connection lines) respectively coupled to (e.g., connected to) each of the gate lines each have substantially the same length (e.g., the combined length of the two connection lines coupled to one gate line is substantially the same as the combined length of two other connection lines coupled to another gate line), and thus the delay time of the gate signal is uniformly maintained, thereby preventing the defects from occurring in the image.

Figure 6:
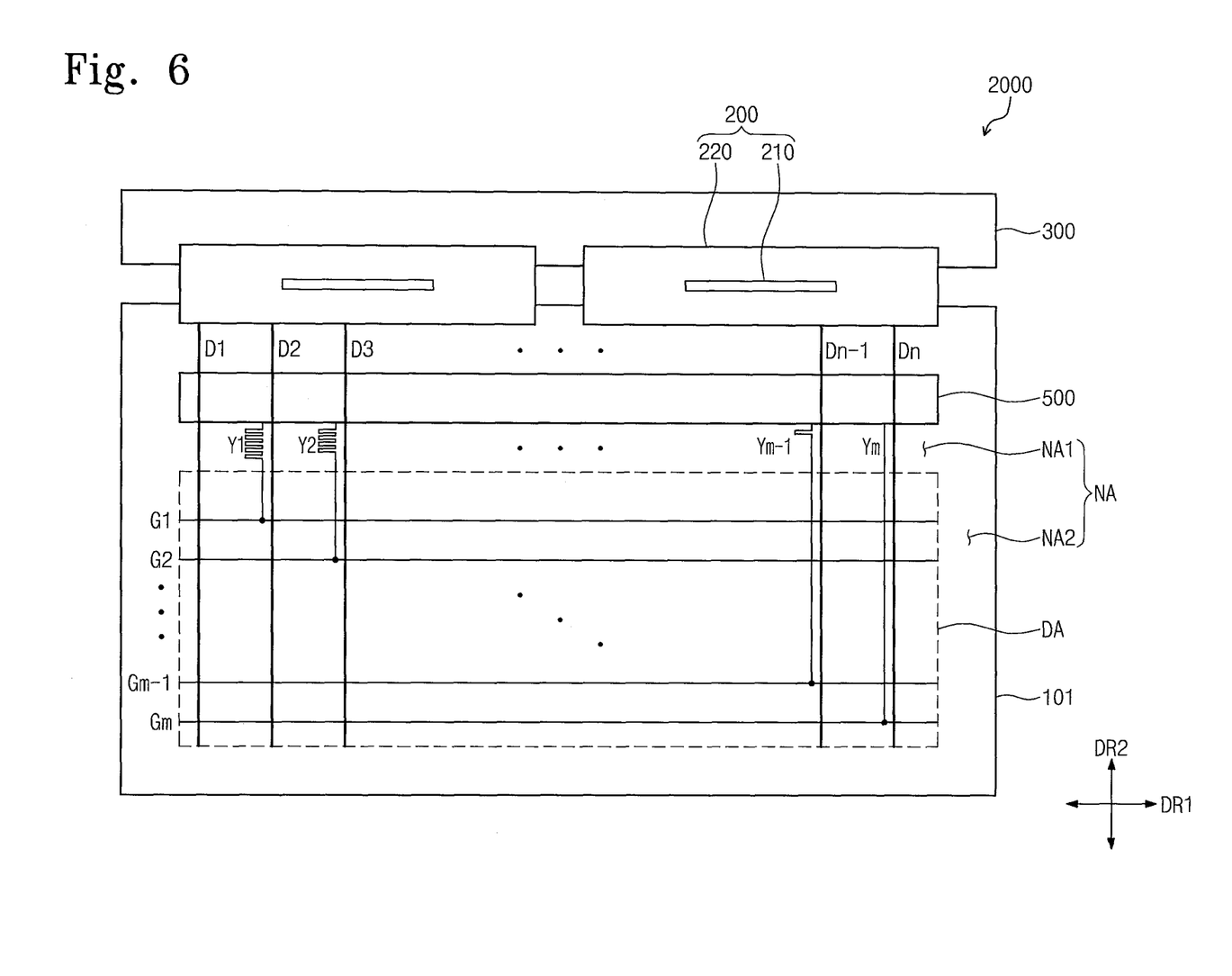
FIG. 6 is a plan view showing a display apparatus according to an example embodiment of the present disclosure.
Figure 7:
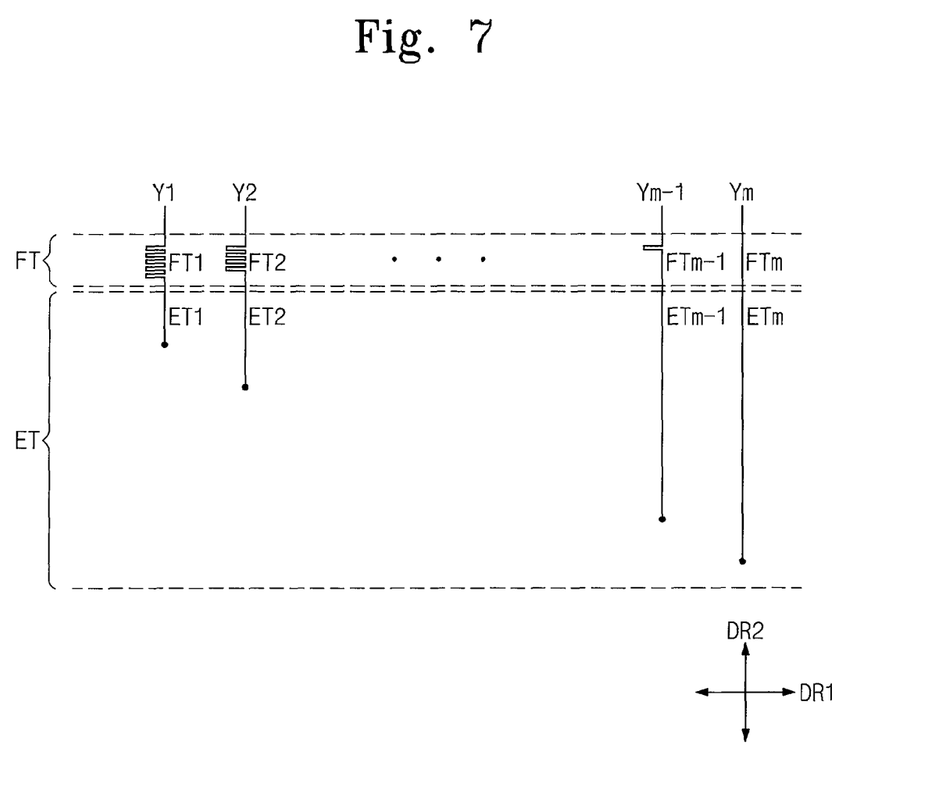
FIG. 7 is a view showing the connection line shown in FIG. 6.

FIG. 6 is a plan view showing a display apparatus 2000 according to an example embodiment of the present disclosure, and FIG. 7 is a view showing a connection line shown in FIG. 6. The display apparatus 2000 has substantially the same structure and function as that of the display apparatus 1000 described with reference to FIGS. 1 to 5, except for the gate driver and the connection line. Accordingly, hereinafter the gate driver and the connection line will be mainly described.

Referring to FIGS. 6 and 7, a display panel 101 includes a gate driver 500 and connection lines Y1 to Ym.

The gate driver 500 is disposed at the first non-display area NA1. For example, in FIG. 6, the gate driver 500 is at the first non-display area NA1 between the display area DA and the flexible printed circuit board 200.

The gate driver 500 is provided as a singular member and coupled to (e.g., connected to) the gate lines G1 to Gm.

The connection lines Y1 to Ym couple (e.g., connect) the gate driver 500 to the gate lines G1 to Gm. The connection lines Y1 to Ym extend along the second direction DR2 in the display area DA and are spaced from (e.g., spaced apart from) the data lines D1 to Dm. The number of the connection lines Y1 to Ym may be equal to the number of the gate lines G1 to Gm. The connection lines Y1 to Ym are coupled to (e.g., connected to) the gate lines G1 to Gm in a one-to-one arrangement.

Each of the connection lines Y1 to Ym includes a fan-out part FT and an extension part ET.

The fan-out part FT extends from the gate driver 500 and is disposed at the first non-display area NA1 between the gate driver 500 and the display area DA. The fan-out part FT may be bent, for example, in a zigzag shape and/or bent multiple times.

The fan-out part FT includes first to m-th fan-out parts FT1 to FTm respectively provided to the connection lines Y1 to Ym. The first to m-th fan-out parts FT1 to FTm may have lengths different from each other. In the present example embodiment, the length of the first to m-th fan-out parts FT1 to FTm becomes shorter (e.g., decreases) from the first fan-out part FT1 to the m-th fan-out part FTm. The length of each of the first to m-th fan-out parts FT1 to FTm may be adjusted or determined by varying the number of bending times (e.g., the number of bends) thereof. As shown in FIG. 6, when the first fan-out part FT1 is bent five times, the second fan-out part FT2 is bent four times, and the m-th fan-out part FTm is not bent (e.g., is substantially straight).

The extension part ET extends from the fan-out part FT and is coupled to (e.g., connected to) the gate lines G1 to Gm. The extension part ET extends along the second direction DR2.

The extension part ET includes first to m-th extension parts ET1 to ETm respectively provided to the connection lines Y1 to Ym. The first to m-th extension parts ET1 to ETm may have lengths different from each other. In the present example embodiment, the length of the first to m-th extension parts ET1 to ETm becomes longer (e.g., increases) from the first extension part ET1 to the m-th extension part ETm.

A resistance of the connection line coupled to (e.g., connected to) an i-th gate line (i is a positive integer number) may be substantially equal or equal to a resistance of the connection line coupled to (e.g., connected to) a j-th gate line (j is a positive integer number and j≠i). The resistance of the connection line is in proportion to the length of the connection line, and thus, a total length of the connection line coupled to (e.g., connected to) the i-th gate line may be equal or substantially equal to a total length of the connection line coupled to (e.g., connected to) the j-th gate line. That is, each of the connection lines Y1 to Ym may have substantially the same or the same length. For instance, the total length of the first connection line Y1 coupled to (e.g., connected to) the first gate line G1 may be substantially equal or equal to the total length of the m-th connection line Ym coupled to (e.g., connected to) the m-th gate line Gm.

A sum of a length of an i-th fan-out part (i is a positive integer number) and a length of an i-th extension part may be substantially equal (e.g., equal) to a sum of a length of a j-th fan-out part (j is a positive integer number and j≠i) and a length of a j-th extension part.

A difference in length between the i-th fan-out part and the j-th fan-out part is substantially equal (e.g., equal) to a difference in length between the i-th extension part and the j-th extension part. For example, the difference in length between the i-th fan-out part (i is a positive integer number) and the j-th fan-out part (j is a positive integer number and j≠i) may be substantially equal or equal to a distance between the i-th gate line and the j-th gate line along the second direction DR2.

Figure 8:
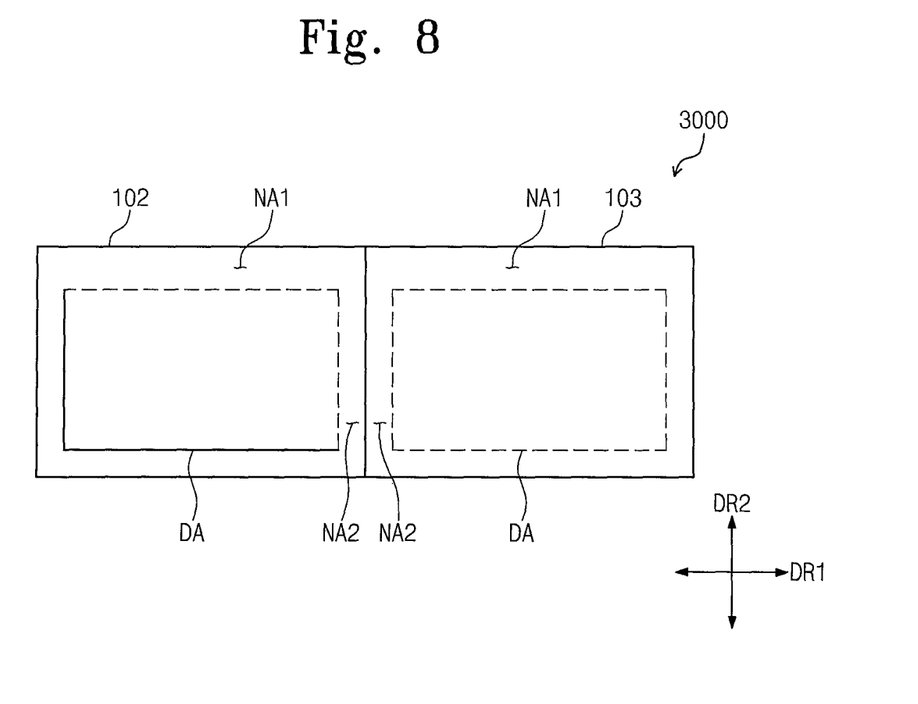
FIG. 8 is a view showing a multi-panel display apparatus according to an example embodiment of the present disclosure.

FIG. 8 is a view showing a multi-panel display apparatus 3000 according to an example embodiment of the present disclosure.

Referring to FIG. 8, the multi-panel display apparatus 3000 includes a plurality of display panels 102 and 103 disposed to be adjacent to each other along the first direction DR1.

Each of the display panels 102 and 103 may be the display panel 100 described with reference to FIGS. 1 to 5 or the display panel 101 described with reference to FIGS. 6 and 7.

A gate driver of each of the display panels 102 and 103 is disposed at the first non-display area NA1 and is not disposed at the second non-display area NA2. Accordingly, a width along the first direction DR1 of the second non-display area NA2 is reduced (e.g., substantially reduced), and thus, a width along the first direction DR1 between the display areas DA of the display panels 102 and 103 is reduced. Therefore, the display panels 102 and 103 are not perceived (e.g., are not perceived by a viewer) as separate display panels even though the second non-display area NA2 exists between the display panels 102 and 103.

The multi-panel display apparatus 3000 shown in FIG. 8 includes two display panels 102 and 103 disposed to be adjacent to each other along the first direction DR1, but the number of the display panels and the arrangement direction of the display panel should not be limited thereto or thereby. That is, the multi-panel display apparatus may include three or more display panels adjacent to each other along the first direction DR1 or the second direction DR2.

Although example embodiments of the present invention have been described herein, it is understood that the present invention should not be limited to these example embodiments but various changes and modifications may be made by one of ordinary skill in the art within the spirit and scope of the present invention as hereinafter claimed and the equivalents thereof.

What is claimed is:

1. A display apparatus comprising:
   a thin film transistor substrate comprising a display area and a non-display area surrounding the display area, the display area comprising gate lines extending along a first direction and data lines extending along a second direction crossing the first direction and insulated from the gate lines;
   a gate driver at a first non-display area of the non-display area outside the display area along the second direction and configured to apply a gate signal to the gate lines; and
   a plurality of connection lines extending along the second direction and coupling the gate driver and the gate lines,
   wherein the plurality of connection lines comprises main connection lines and sub-connection lines, each of the gate lines being coupled to one of the main connection lines and one of the sub-connection lines,
   wherein a sum of resistance of an i-th main connection line (i being a positive integer number) of the main connection lines and an i-th sub connection line of the sub connection lines is substantially equal to a sum of resistance of a j-th main connection line (j being a positive integer number and j≠i) of the main connection lines and a j-th sub connection line of the sub connection lines, and
   wherein the i-th main connection line and the i-th sub connection line are coupled to a i-th gate line of the gate lines, and the j-th main connection line and the j-th sub connection line are coupled to an i-th gate line of the gate lines.

2. The display apparatus of claim 1, wherein the connection lines are spaced from and insulated from the data lines.

3. The display apparatus of claim 2, wherein at least a portion of the connection lines is at a same layer as the data lines.

4. The display apparatus of claim 3, wherein the thin film transistor substrate further comprises a gate insulating layer between the gate lines and the data lines and has a contact opening, and wherein the connection lines are respectively electrically coupled to the gate line at the contact opening.

5. A display apparatus comprising:
   a thin film transistor substrate comprising a display area and a non-display area surrounding the display area, the display area comprising gate lines extending along a first direction and data lines extending along a second direction crossing the first direction and insulated from the gate lines;
   a gate driver at a first non-display area of the non-display area outside the display area along the second direction and configured to apply a gate signal to the gate lines; and
   a plurality of connection lines extending along the second direction and coupling the gate driver and the gate lines, wherein the plurality of connection lines comprises main connection lines and sub-connection lines, each of the gate lines being coupled to one of the main connection lines and one of the sub-connection lines, and wherein a combined length of the main connection line and the sub-connection line coupled an i-th gate line (i being a positive integer number) of the gate lines and a combined length of the main connection line and the sub-connection line coupled to a j-th gate line (j being a positive integer number and j≠i) are substantially equal.

6. The display apparatus of claim 5, wherein the gate driver comprises a first gate driver and a second gate driver spaced from the first gate driver, and wherein the main connection lines couple the first gate driver to each of the gate lines, and the sub-connection lines couple the second gate driver to each of the gate lines.

7. The display apparatus of claim 6, wherein the main connection lines have lengths different from each other, and the sub-connection lines have lengths different from each other.

8. The display apparatus of claim 6, wherein each of the main connection lines has a length shorter than that of each of the sub-connection lines.

9. The display apparatus of claim 8, wherein the length of each of the main connection lines is the shortest length between the first gate driver and each of the gate lines along the second direction.

10. The display apparatus of claim 8, wherein the sub-connection lines extend from the second gate driver along the second direction through the display area and are bent at the first non-display area to be coupled to the respective gate lines.

11. A multi-panel display apparatus comprising:
a plurality of display panels adjacent to each other along a first direction;
a printed circuit board configured to drive the display panels; and
a flexible printed circuit board that electrically couples the display panels to the printed circuit board, each of the display panels comprising:
a thin film transistor substrate comprising a display area and a non-display area surrounding the display area, the display area comprising gate lines extending along a first direction and data lines extending along a second direction crossing the first direction and insulated from the gate lines;
a gate driver at a first non-display area of the non-display area outside the display area along the second direction and configured to apply a gate signal to the gate lines; and
a plurality of connection lines extending along the second direction and coupling the gate driver and the gate lines,
wherein a resistance of the connection line coupled to an i-th gate line (i being a positive integer number) of the gate lines is substantially equal to a resistance of the connection line coupled to a j-th gate line (j being a positive integer number and j≠i), and
wherein the plurality of connection lines comprises main connection lines and sub-connection lines, each of the gate lines being coupled to one of the main connection lines and one of the sub-connection lines, and
wherein a combined length of the main connection line and the sub-connection line coupled to the i-th gate line and a combined length of the main connection line and the sub-connection line coupled to the j-th gate line are substantially equal.

\* \* \* \* \*